US009812638B2

(12) United States Patent
Bethune et al.

(10) Patent No.: US 9,812,638 B2
(45) Date of Patent: Nov. 7, 2017

(54) BACKEND OF LINE (BEOL) COMPATIBLE HIGH CURRENT DENSITY ACCESS DEVICE FOR HIGH DENSITY ARRAYS OF ELECTRONIC COMPONENTS

(75) Inventors: Donald S Bethune, San Jose, CA (US); Kailash Gopalakrishnan, San Jose, CA (US); Andrew J Kellock, Sunnyvale, CA (US); Rohit S Shenoy, Fremont, CA (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 1976 days.

(21) Appl. No.: 12/727,746

(22) Filed: Mar. 19, 2010

(65) Prior Publication Data

US 2011/0227023 A1 Sep. 22, 2011

(51) Int. Cl.
*H01L 45/00* (2006.01)
*H01L 27/24* (2006.01)

(52) U.S. Cl.
CPC .......... *H01L 45/00* (2013.01); *H01L 27/2409* (2013.01); *H01L 45/06* (2013.01); *H01L 45/1233* (2013.01)

(58) Field of Classification Search
CPC ..... H01L 27/2409; H01L 45/00; H01L 45/06; H01L 45/1233
USPC .............. 257/2–5, 471–473, 485, E27.009, 257/E27.012, E27.016, E29.068, E29.079; 365/148, 163, 174, 175, 242, 243
See application file for complete search history.

(56) References Cited

U.S. PATENT DOCUMENTS

| | | | |
|---|---|---|---|
| 5,761,115 A * | 6/1998 | Kozicki et al. | 365/182 |
| 6,181,013 B1 | 1/2001 | Liu et al. | |
| 6,838,307 B2 * | 1/2005 | Gilton | 438/95 |
| 7,245,523 B2 | 7/2007 | Ho et al. | |
| 7,368,822 B2 | 5/2008 | Lee et al. | |
| 7,382,647 B1 * | 6/2008 | Gopalakrishnan | 365/163 |
| 7,393,699 B2 | 7/2008 | Tran | |
| 7,479,650 B2 | 1/2009 | Gilton | |
| 2007/0029538 A1 * | 2/2007 | Pinnow | 257/4 |
| 2007/0133358 A1 | 6/2007 | Kubo et al. | |
| 2008/0314739 A1 | 12/2008 | Gopalakrishnan et al. | |
| 2009/0097299 A1 | 4/2009 | Tanaka et al. | |

* cited by examiner

*Primary Examiner* — Allison P Bernstein
(74) *Attorney, Agent, or Firm* — Heslin Rothenberg Farley & Mesiti P.C.

(57) ABSTRACT

A device has a $M_8XY_6$ layer in between a first conductive layer on the top and a second conductive layer on the bottom, wherein (i) M includes at least one element selected from the following: Cu, Ag, Li, and Zn, (ii) X includes at least one Group XIV element, and (iii) Y includes at least one Group XVI element. Another device has $M_aX_bY_c$ material contacted on opposite sides by respective layers of conductive material, wherein: (i) M includes at least one element selected from the following: Cu, Ag, Li, and Zn, (ii) X includes at least one Group XIV element, and (iii) Y includes at least one Group XVI element, and a is in the range of 48-60 atomic percent, b is in the range of 4-10 atomic percent, c is in the range of 30-45 atomic percent, and a+b+c is at least 90 atomic percent.

21 Claims, 21 Drawing Sheets

BACKEND OF LINE (BEOL) COMPATIBLE HIGH CURRENT DENSITY ACCESS DEVICE FOR HIGH DENSITY ARRAYS OF ELECTRONIC COMPONENTS

BACKGROUND OF THE INVENTION

Field of Invention

The present invention relates generally to the field of high current density access devices. More specifically, the present invention is related to back end of line (BEOL) compatible high current density access devices for high density arrays of electronic components.

Discussion of Related Art

In order to increase the density of memory technologies (both volatile and nonvolatile), a crosspoint design is preferred. In such an optimized design, the wordline and bitlines (henceforth referred to as memory lines) run at minimum pitch=2F, where F refers to the lithographic minimum feature size (for example, 32 nm), and a storage element is placed between these perpendicularly oriented memory lines at their crosspoints. Two possible designs exist in such memory technologies:

(a) A Nano-Crossbar Design: Refers to a design where the memory lines run at sublithographic pitches. In this design, memory cell area is reduced from $4F^2$ to $4F_s^2$ where $2F_s$ is the nanoscale pitch and $F_s \ll F$, where F is the above-mentioned lithographic minimum feature size. Previous studies detail how these sublithographic features are interfaced to lithographically defined wordline and bitline driver/decoder circuits.

(b) A 3D Design: Refers to a design where the memory lines run at lithographic pitches, with multiple layers of memories being provided. The effective area of these cells is therefore $4F^2/n$, where n is the number of 3D layers.

In either design case described above, two device components are needed at the intersection of the memory lines:

(a) A Memory Element: Refers to an element that is used to store data/information. Many options exist here (including, for example, phase change memory (PCM), MRAM, solid electrolyte memory, FeRAM, etc.), with one promising memory node material being PCM.

(b) A Rectifying Element or Access Device: Since a transistor is not provided at every crosspoint, a device is needed to rectify (exhibit nonlinearity). This ensures that the memory cells that lie on unselected wordlines and bitlines are not inadvertently programmed or shorted to each other and do not leak any significant amount of current.

For most promising memory materials, programming current densities that are of the order of $10^7$-$10^8$ A/cm$^2$ are needed for critical dimensions (CDs) down in the range of 20-40 nm. FIG. 1 illustrates a graph of reset current and reset current density versus critical dimension for resistive memory elements that controllably change phase upon the passage of current. It can be seen from FIG. 1 that currents reduce with scaling but current densities increase substantially due to thermal losses that increase with scaling.

It should be noted that since the PCM CD is smaller than F (to minimize reset currents and to minimize proximity effects), the effective current density in the series diode is somewhat smaller. If the PCM CD ranges from 0.5F (¼th of the pitch) to 0.66F (⅓rd of the pitch), the reset currents in the diode would be 2.25× to 4× smaller. However, such current densities are still extremely high.

The best known single-crystal silicon p-n and Schottky diodes that can be used for rectification provide 1-2×10$^7$ A/cm$^2$ at low voltages. This limit comes from a number of different factors including high level injection effects in p-n junctions, series resistance of doped region(s), etc. This is an order of magnitude smaller than what is needed for most resistive memory elements. In addition, the quality of the diodes that can be fabricated in middle-of-line (MOL) or back end of line (BEOL) lower temperature processes are typically much worse since they have to be made in amorphous or polycrystalline silicon that has much lower mobility. These considerations prevent the use of p-n junctions in either single-crystal silicon or other silicon materials as rectifiers for high-current memory elements (especially in 3D).

In addition, the current through unselected cells has to be small to prevent array-disturbs and reduce programming power. Typically a rectification ratio well in excess of 10 times the number of elements on the WL or BL is needed. In other words, for typical Mbit arrays, a rectification ratio of 10000 or above is needed (preferably exceeding 10$^7$). The rectification ratio is typically a function of the bias since the leakage is typically a function of bias.

Solutions developed by the current assignee involves the use of a solid electrolyte (SE) device element (see, for example, U.S. Pat. No. 7,382,647) as an access (diode) element for PCM. The advantage of such approaches involve the ON/OFF ratio, as the SE can provide very high currents in the ON state (since it has a metallic filament that bridges the two electrodes) and very low OFF currents. However, disadvantages with this approach include:

(a) the need for an explicit erase step to erase the filament, wherein such an erase step can be quite slow (for example, 100's of microseconds are needed to erase a thick filament), and (b) the low reliability/endurance of the SE element during high current programming.

There is therefore the need for an access device (for use as an access element for semiconductor memory arrays) that can supply high current-densities and operate reliably while being fabricated at temperatures that are compatible with standard BEOL processing (i.e., at sub 400° C.).

In addition, there are other electronic applications involving dense arrays of components, such as liquid crystal displays (LCDs) and organic light-emitting diodes (OLEDs) arrays, which require an access element that would provide single (or multiple) element addressability while blocking multiple current paths through half-selected or unselected elements.

In typical Active-Matrix LCD (AMLCD) displays, each pixel has a Thin Film Transistor (TFT) in series with a pixel electrode and a storage capacitor. The TFT, which functions as the access element, can be fabricated using amorphous silicon (a-Si), high-temperature polysilicon (HTPS) or Low Temperature Polysilicon (LTPS). The disadvantage of the a-Si approach is that the mobility of carriers is very low in such devices. The high-temperature polysilicon approach is compatible only with quartz substrates (which are much more expensive and limited to 8-10 inch diagonal sizes) as opposed to ordinary glass (limited to 600° C.). The LTPS approach uses a laser annealing process and has mobilities 200× higher than the amorphous silicon versions but is still lower than the HTPS approach. In addition, the a-Si approach does not allow the integration of drive electronics (that drive the row and the column busses) onto the glass itself requiring the use of a separately fabricated LCD driver circuit that is attached to the glass via TAB (Tape Automated Bonding). In order to achieve higher density displays (i.e., to reduce pixel size), it is desired to increase the drive current of these access elements. This also allows the integration of the driver circuitry onto the glass itself further reducing integration costs. A thin film diode (TFD) access element is preferred because it further reduces pixel size but has found limited use due to device uniformity and threshold stability issues.

Therefore, what is needed is a new thin film diode (TFD) or access device material with high current densities and with limited variability for use in TFD-based AMLCD displays. Further, there is also a need for a thin film diode (TFD) for Active-Matrix OLED Displays.

Embodiments of the present invention are an improvement over prior art systems and methods.

SUMMARY OF THE INVENTION

The present invention provides for a device comprising: a first conductive layer (e.g., a Cu layer or a $Cu_3Ge$ layer), a second conductive layer (e.g., a tungsten layer), and a $M_8XY_6$ layer sandwiched in between said first conductive layer on top and said second conductive layer on bottom, wherein (i) M includes at least one element selected from the group consisting of Cu, Ag, Li, and Zn, (ii) X includes at least one Group XIV element (e.g., Ge, Si, Sn, and C), and (iii) Y includes at least one Group XVI element (e.g., Se, S, O, and Te), and wherein said first conductive layer, second conductive layer and $M_8XY_6$ layer are in proximity to each other, thereby allowing current to pass through. Specific non-limiting examples of $M_8XY_6$ include any of the following: $Cu_8GeS_6$, $Cu_8GeSe_6$ and $Ag_{4.7}Cu_{3.3}GeS_6$. In one embodiment, M comprises a plurality of elements $M_{a1} \ldots M_{an}$, wherein $a_1 + \ldots + a_n = 8$.

The present invention also provides for a device comprising: an $M_aX_bY_c$ material contacted on opposite sides by respective layers of conductive material (e.g., a Cu layer or a $Cu_3Ge$ layer), wherein: (i) M includes at least one element selected from the group consisting of Cu, Ag, Li, and Zn, (ii) X includes at least one Group XIV element (e.g., Ge, Si, Sn, and C), and (iii) Y includes at least one Group XVI element (e.g., Se, S, O, and Te), and wherein a is in the range of 48-60 atomic percent, b is in the range of 4-10 atomic percent, c is in the range of 30-45 atomic percent, and a+b+c is at least 90 atomic percent, and wherein said $M_8XY_6$ material and said layers of conductive material are in proximity to each other, thereby allowing current to pass through. In the preferred embodiment, the $M_aX_bY_c$ material is an argyrodite material of the formula $M_8X_1Y_6$. Specific non-limiting examples of $M_8XY_6$ include any of the following: $Cu_8GeS_6$, $Cu_8GeSe_6$ and $Ag_{4.7}Cu_{3.3}GeS_6$.

The present invention also provides for an apparatus comprising a first device as described above and a second device as described above, wherein the first and second devices are in series.

The present invention also provides for a crosspoint memory array comprising bit lines, word lines, and crosspoint elements at the intersection of the bit lines and the word lines, wherein each crosspoint element includes a memory element and a device as described above. In an extended embodiment, the memory element of the crosspoint memory array includes a phase change memory material.

In one embodiment, at least one of said conductive layers includes an electrode that is inert with respect to the $M_aX_bY_c$ material.

In another embodiment, an amount of current passed by said device varies by a factor of at least $10^6$ in response to varying the applied voltage by 0.5 V.

In another embodiment, the device further includes a first dielectric layer between the $M_aX_bY_c$ material and one of the conductive layers. In an extended embodiment, the device further includes a second dielectric layer between the $M_aX_bY_c$ material and the other one of the conductive layers.

In one embodiment, the $M_aX_bY_c$ material includes both Cu and Ag, wherein each of Cu and Ag constitute at least 1 atomic percent of the $M_aX_bY_c$ material.

In another embodiment, the device further including a dopant, the dopant being at least one element selected from the group consisting of N, P, Zn, W, Sb, F, Cl, Br and I, the dopant constituting at least 1 atomic percent but less than 10 atomic percent of the $M_aX_bY_c$ material.

DESCRIPTION OF THE PREFERRED EMBODIMENTS

Figure 1:
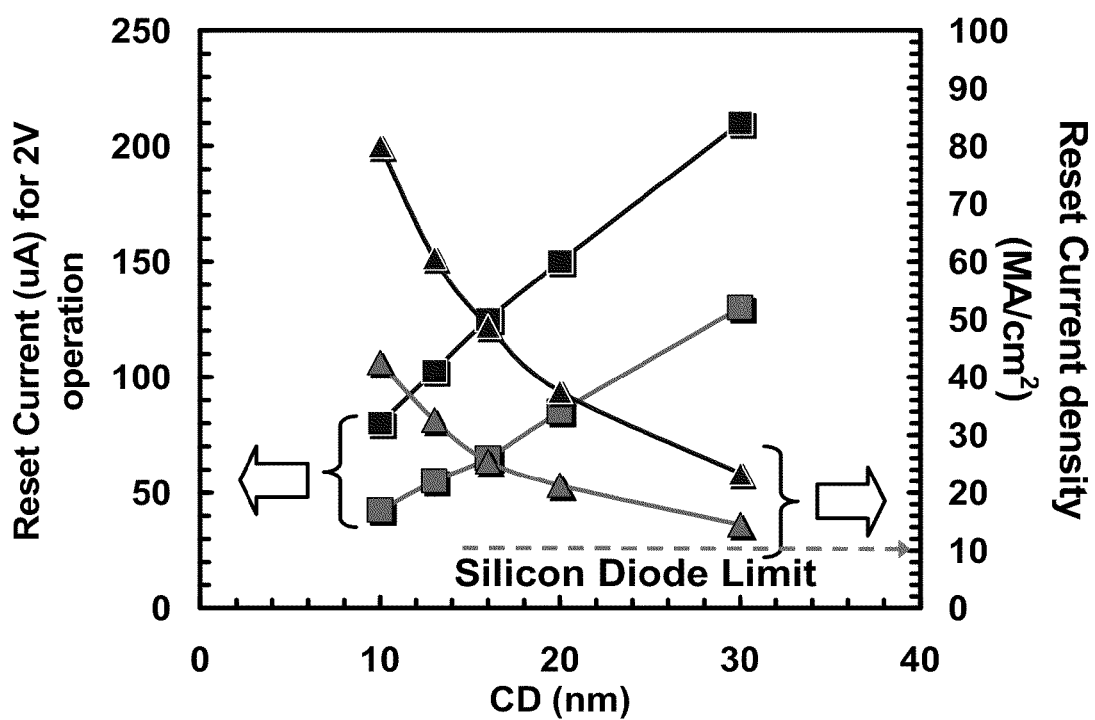
FIG. 1 illustrates a graph of reset current and reset current density versus critical dimension for resistive memory elements that controllably change phase upon the passage of current.

While this invention is illustrated and described in preferred embodiments, the invention may be produced in many different configurations. There is depicted in the drawings, and will herein be described in detail, preferred embodiments of the invention, with the understanding that the present disclosure is to be considered as an exemplification of the principles of the invention and the associated functional specifications for its construction and is not intended to limit the invention to the embodiments illustrated. Those skilled in the art will envision many other possible variations within the scope of the present invention.

The present invention teaches the use of a new family of crystalline materials as high-current density "access devices" in electronic applications involving dense arrays of components such as memories and displays. This family of materials have the chemical formula $M_8XY_6$ (henceforth abbreviated as 816), where M is typically a metallic element including but not limited to Cu, Ag, Li, or Zn, X is a Group XIV element including but not limited to Ge, Si, Sn or C, and Y is a Group XVI or chalcogen element including but not limited to S, Se, Te or O. Specific examples of such materials include $Cu_8GeS_6$, $Cu_8GeSe_6$, etc. However, it should be noted that combinations of various elements above, such as $Ag_{4.7}Cu_{3.3}GeS_6$, could also be used, and such combinations are within the scope of the present invention.

It should be noted that M may comprises a plurality of elements $M_{a1} \ldots M_{an}$, wherein $a_1 + \ldots + a_n = 8$.

A Schottky barrier like diode or access device is provided that can be fabricated under conditions compatible with low-temperature back end of line (BEOL) semiconductor processing conditions, can supply high currents at low voltages, and can exhibit high on-off ratios. The Schottky barrier like access device includes a layer of crystalline semiconductor of the argyrodite family adjacent to at least one metal.

Experiments have shown that these materials can be easily fabricated at BEOL compatible temperatures (sub 400° C.). In addition, access-devices fabricated using these materials have been shown to carry high current densities and exhibit excellent ON/OFF ratios when sandwiched between appropriate electrodes.

In one embodiment, a thin-film of 816 material (typically 20-100 nm; preferably in the range between 50-70 nm) is sandwiched between two conductive regions, wherein the conductive regions may be metals or different semiconductors. For example, when a 40 nm film of $Cu_8GeS_6$ is sandwiched between W and Cu-containing electrodes, the materials exhibit n-type Schottky diode-like characteristics with the W electrode when the Cu electrode is swept negative with respect to the W layer.

Some of the advantages of the present invention include: (a) reliability—access device characteristics do not change appreciably upon high-current cycling, unlike the solid electrolyte approaches, (b) excellent ON/OFF ratio—depending on M, X and Y, and (c) current densities exceed $5 \times 10^6$ A/cm$^2$—which is a distinct advantage over amorphous Si or polycrystalline silicon.

Figure 2:
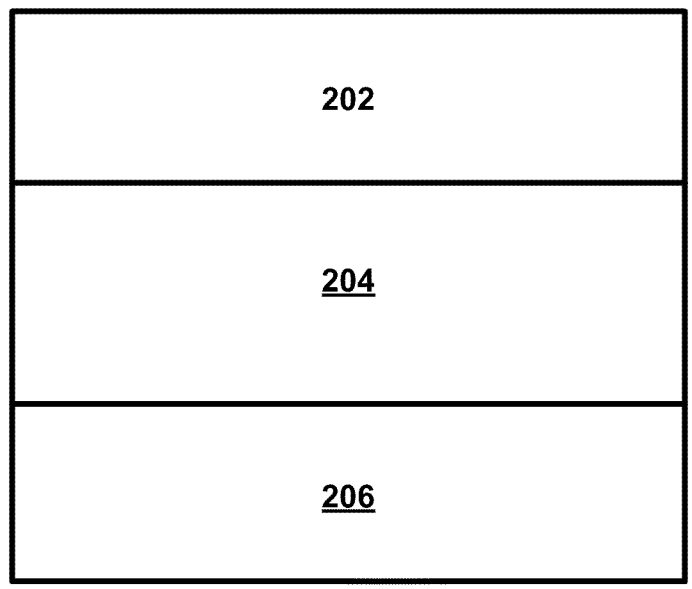
FIG. 2 illustrates the present invention's basic device structure where a thin film of $M_8XY_6$ material is sandwiched between two conductive regions

The basic device structure for use as an access device is shown in FIG. 2 where a thin film of $M_8XY_6$ material 204 is sandwiched between two conductive regions 202 and 206.

Although only one thin film of $M_8XY_6$ is shown in the accompanying figures, it should be noted that this single layer may be substituted with multiple layers of $M_8XY_6$ films with differing compositions. Such a modification is within the scope of the present invention.

Figure 3:
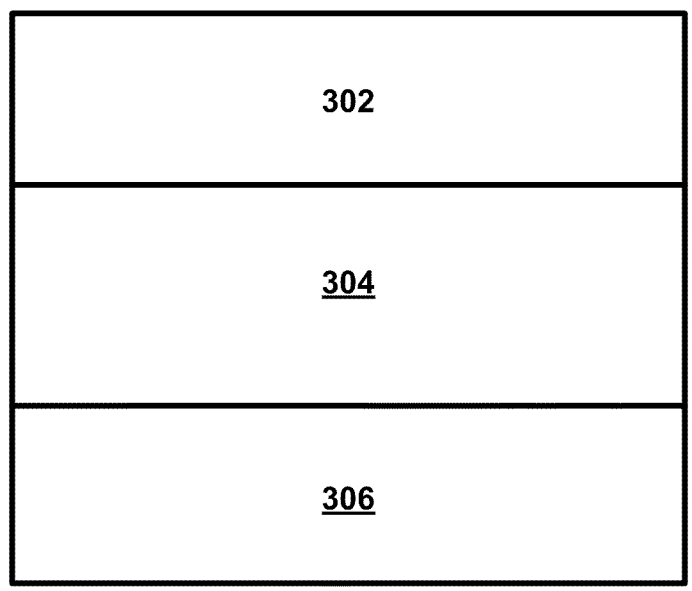
FIG. 3 illustrates another embodiment of the present invention, where a thin-film of $Cu_8GeS_6$ layer is sandwiched between W and Cu (or $Cu_3Ge$) electrodes.
Figure 4:
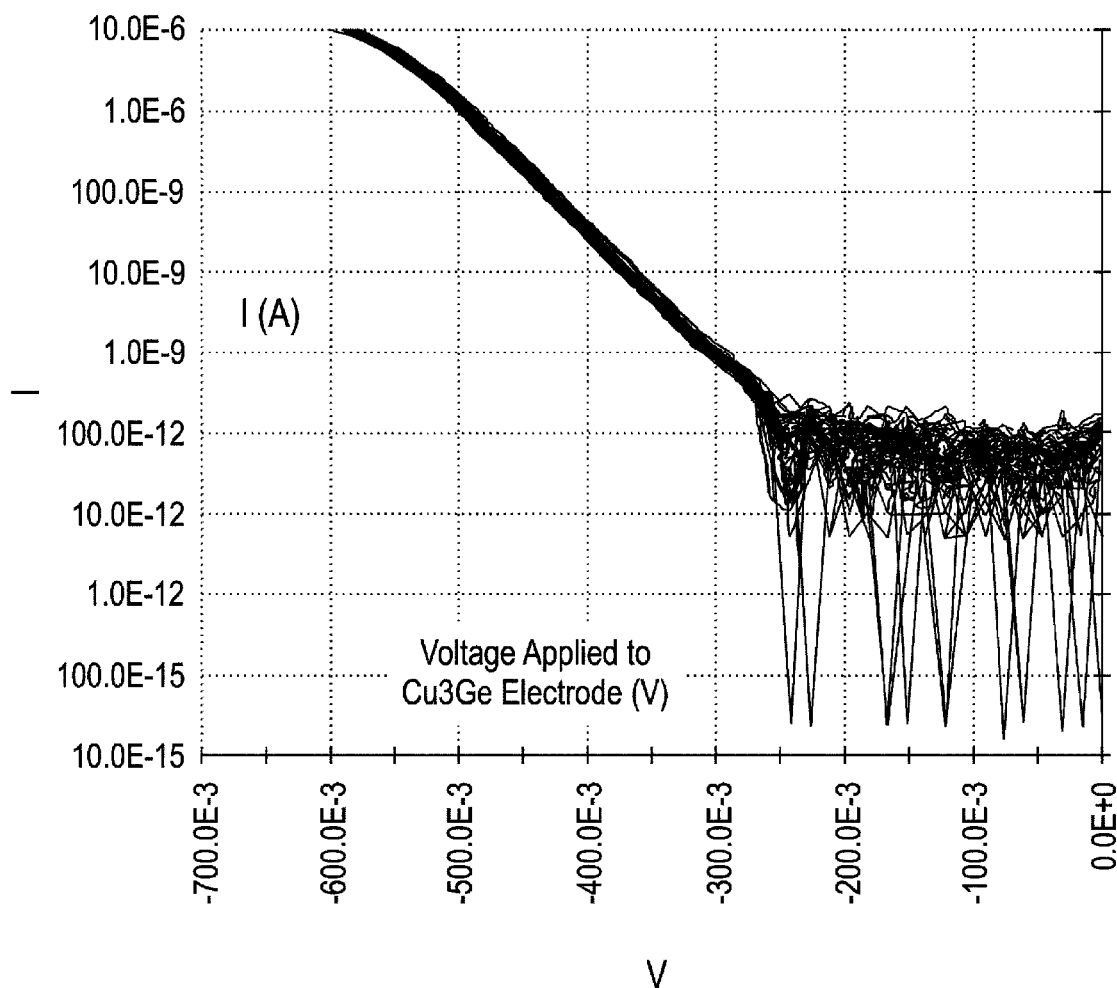
FIG. 4 illustrates I-V characteristics of the 70 nm access device of FIG. 3

Another embodiment is shown in FIG. 3, where a thin-film of $Cu_8GeS_6$ 304 is sandwiched between W electrode 306 and Cu (or $Cu_3Ge$) electrode 302. When the Cu electrode (or $Cu_3Ge$ electrode) 302 in the 2-terminal device in FIG. 3 is swept from 0 to negative voltages, the material shows an n-type Schottky-barrier like behavior with respect to the tungsten electrode. As the voltage on the $Cu_3Ge$ electrode is swept negative, the I-V characteristics show an exponential dependency of current on applied voltage (see FIG. 4). FIG. 4 illustrates I-V characteristics of the access device of FIG. 3, wherein current measurements are limited to 100 pA on the lower side (because of noise limitations of the instrumentation and the setup) and current compliance is chosen to be at 10 μA. In addition, pulsed measurements showed that very high current densities (>$5 \times 10^6$) can be carried in these devices.

Figure 5:
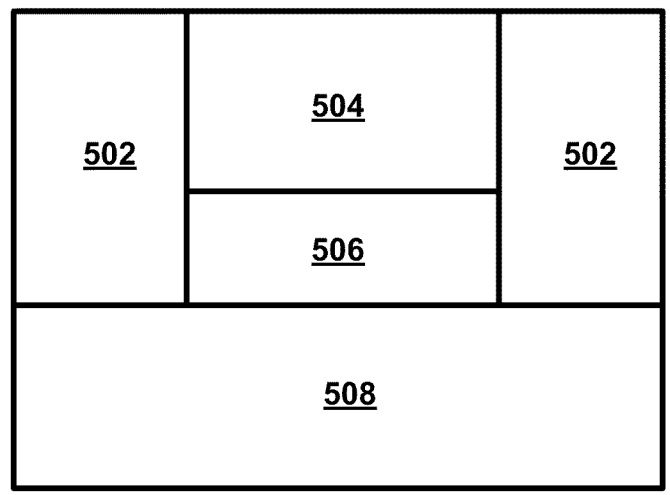
FIG. 5 depicts a simple device structure for the access-device stack, wherein a thin film of $M_8XY_6$ is sandwiched between two appropriate metal lines to form a 2-terminal device of the type shown in FIG. 2.

Device Structures:

Many possible device structures exhibiting the above characteristics could be fabricated using semiconductor fabrication tools and processes. FIG. 5 depicts a simple device structure for the access-device stack. In the simplest possible device structure shown in FIG. 5, a thin film of $M_8XY_6$ 506 is sandwiched between two appropriate metal lines (e.g., tungsten metal lines) 504 and 508 to form a 2-terminal device of the type shown in FIG. 2. One way of building such a structure is to fill the $M_8XY_6$ material into a pore or a via, wherein the dielectrics 502 into which the via is etched could be made of silicon oxide, silicon nitride or some other low-K dielectric.

Figure 6:
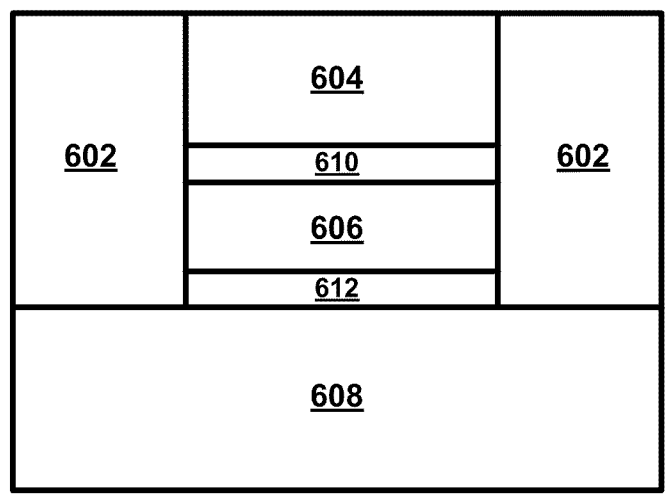
FIG. 6 depicts another possible device structure of the stack shown in FIG. 3, wherein a thin-film of $M_8XY_6$ and additional interfacial layers are sandwiched between 2 dielectrics in a via.

FIG. 6 depicts another possible device structure embodiment of the stack shown in FIG. 3. In this case, a thin-film of $M_8XY_6$ 606 and a plurality of additional interfacial layers 610 and 612 are sandwiched between two dielectrics 602 in a via. Elements 604 and 608 reference two appropriate metal lines (e.g., tungsten metal lines). The structure shown in FIG. 6 is the similar to the structure shown in FIG. 5 except that one or more additional interfacial layers are added between the $M_8XY_6$ material and the metal lines, wherein the interfacial layer could modify the access device characteristics, and may be added to one or both of the interfaces. In one specific example, the interfacial layer is 10 Angstroms-thick layer of Silicon Nitride.

FIG. 5 and FIG. 6 show embodiments where a thin film of $M_8XY_6$ is between two perpendicularly oriented lines. However, it is also possible to have $M_8XY_6$ and its associated interfacial layers and electrodes connect to other elements in series such as memory elements (e.g., PCM, M-RAM, etc.), resistors, LED stack or liquid crystal elements.

Furthermore, there are many other device structures possible other than the illustrated ones, including mushroom-shaped cells, recessed mushroom cells, ring-shaped electrode and pillar cells. For these structures, many different process flows (integration schemes) are possible.

Furthermore, in some cases, where a thin film of $M_8XY_6$ is sandwiched between two electrodes, it might be advantageous to scale the area of one of the contacts relative to the other to tune the electrical properties of this stack.

Techniques to Produce $M_8XY_6$

Various methods may be used to produce $M_8XY_6$, some of which are listed below. It should be noted, however, that this list is by no means an exhaustive one, as other methods may be used to produce the same structure.

(a) Directly heating a mixture of $XY_2$ and $M_2Y$ in a 1:4 molar ratio and annealing the mixture in a vacuum ambient at high temperatures. Many other combinations are also possible—for example, using $M_{1.33}Y$ and X in a 6:1 molar ratio.

(b) Directly sputtering a thin film of $M_8XY_6$ using co-sputtering from one or more targets. Reactive gases (including those containing Y) may also be used. Furthermore, it might be advantageous to deposit the $M_8XY_6$ at high temperatures. Some examples include:

deposition from a $M_8XY_6$ target;
deposition from a $M_8XY_6$ target in the presence of $H_2Y$;
co-sputtering from $M_xY$ and X targets; or
deposition from M and X in a $H_2Y$ or other reactive ambient.

(c) Chemical Vapor Deposition (CVD) or Atomic Layer Deposition (ALD) processes to deposit $M_8XY_6$ on any desired substrate.

(d) Reaction Post Deposition: Alternatively, it might be preferred to deposit two separate layers that upon annealing form $M_8XY_6$. For example: $GeS_x$ and Cu (or some copper containing compounds, such as, AgCu) could be made to react at <250° C. to form $Cu_8GeS_6$ with additional layers.

Specific Embodiments with PCM:

There are a number of possible structures that combine PCM and $M_8XY_6$. Representative examples of these structures are provided, along with associated process flows and integration schemes.

There are several PCM cell structures of interest—including mushroom, recessed-mushroom, pore-cell (or memory-in-via) and ring-shaped electrode. Each structure could be fabricated using a number of different flows. Each device structure for the $M_8XY_6$ selection device could be combined with one of the four PCM cell structures to yield a variety of possible structures/process-flows.

Further, instead of being made out of $M_8XY_6$ material, the access-device could have a $M_aX_bY_c$ material composition where:
  (i). M includes at least one element selected from the group consisting of Cu, Ag, Li, and Zn,
  (ii). X includes at least one Group XIV element (e.g., Ge, Si, Sn, C, and Pb),
  (iii). Y includes at least one Group XVI element (e.g., Se, S, O, and Te), and
wherein a is in the range of 48-60 atomic percent; b is in the range of 4-10 atomic percent; c is in the range of 30-45 atomic percent; and a+b+c is at least 90 atomic percent.

Figure 7:
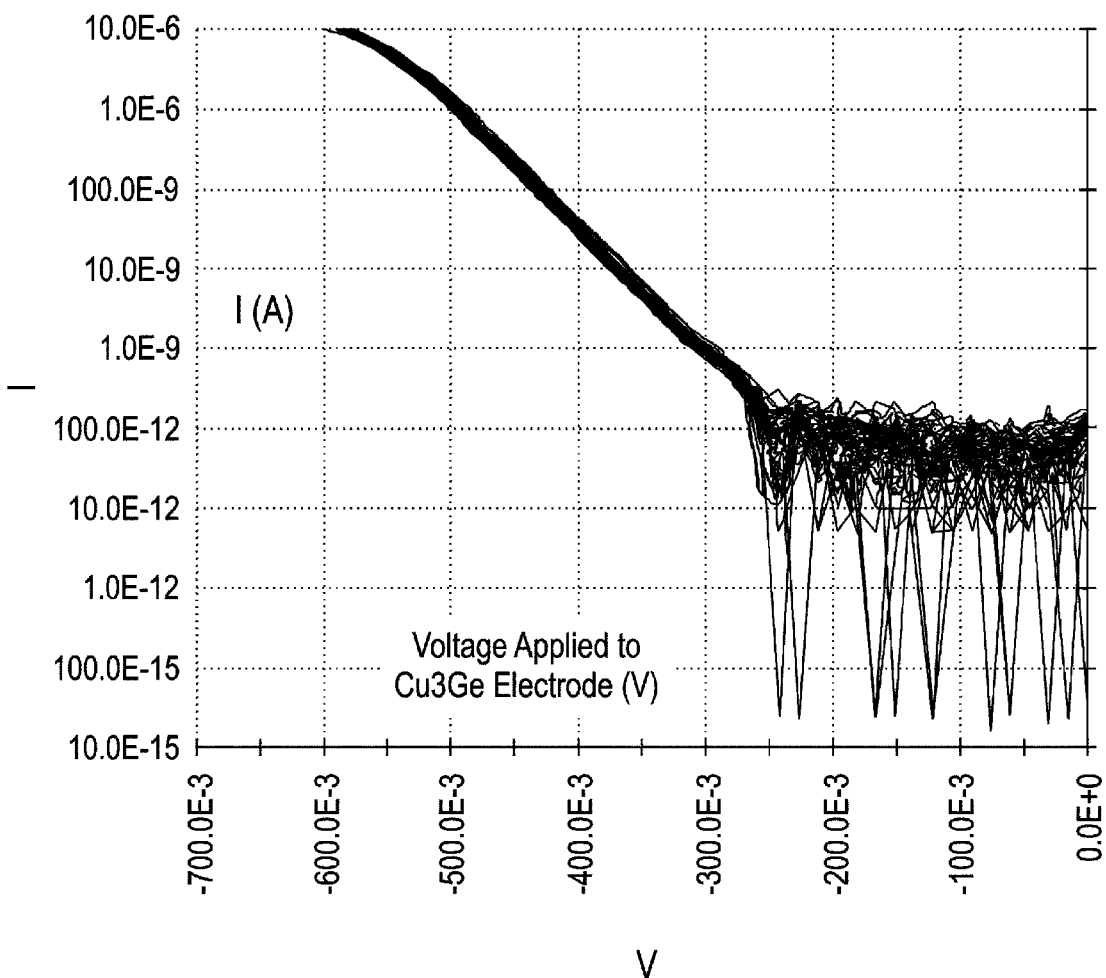
FIGS. 7-11 depict the I-V characteristics of various device configurations based on the teachings of the present invention.
Figure 8:
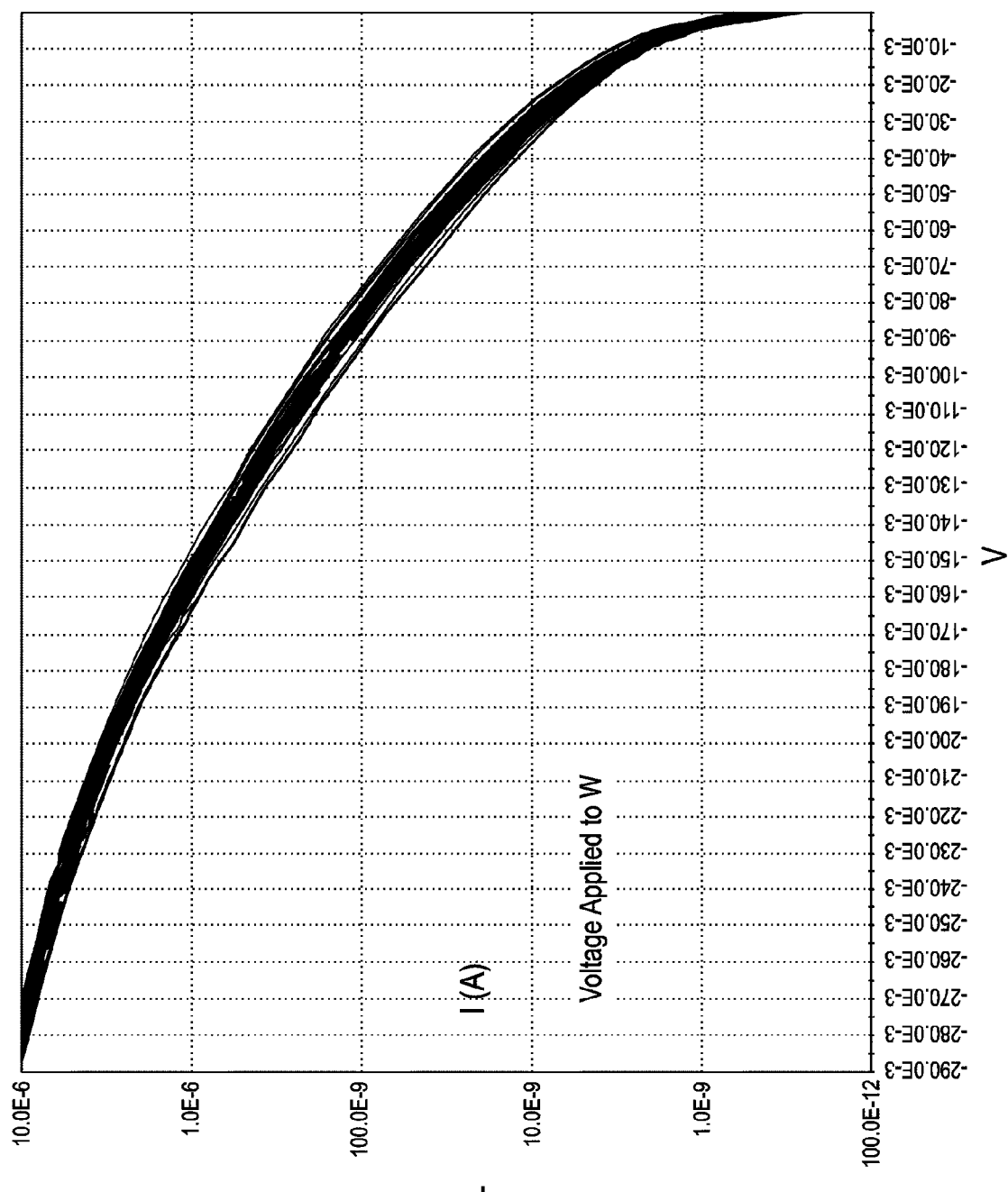
Figure 9:
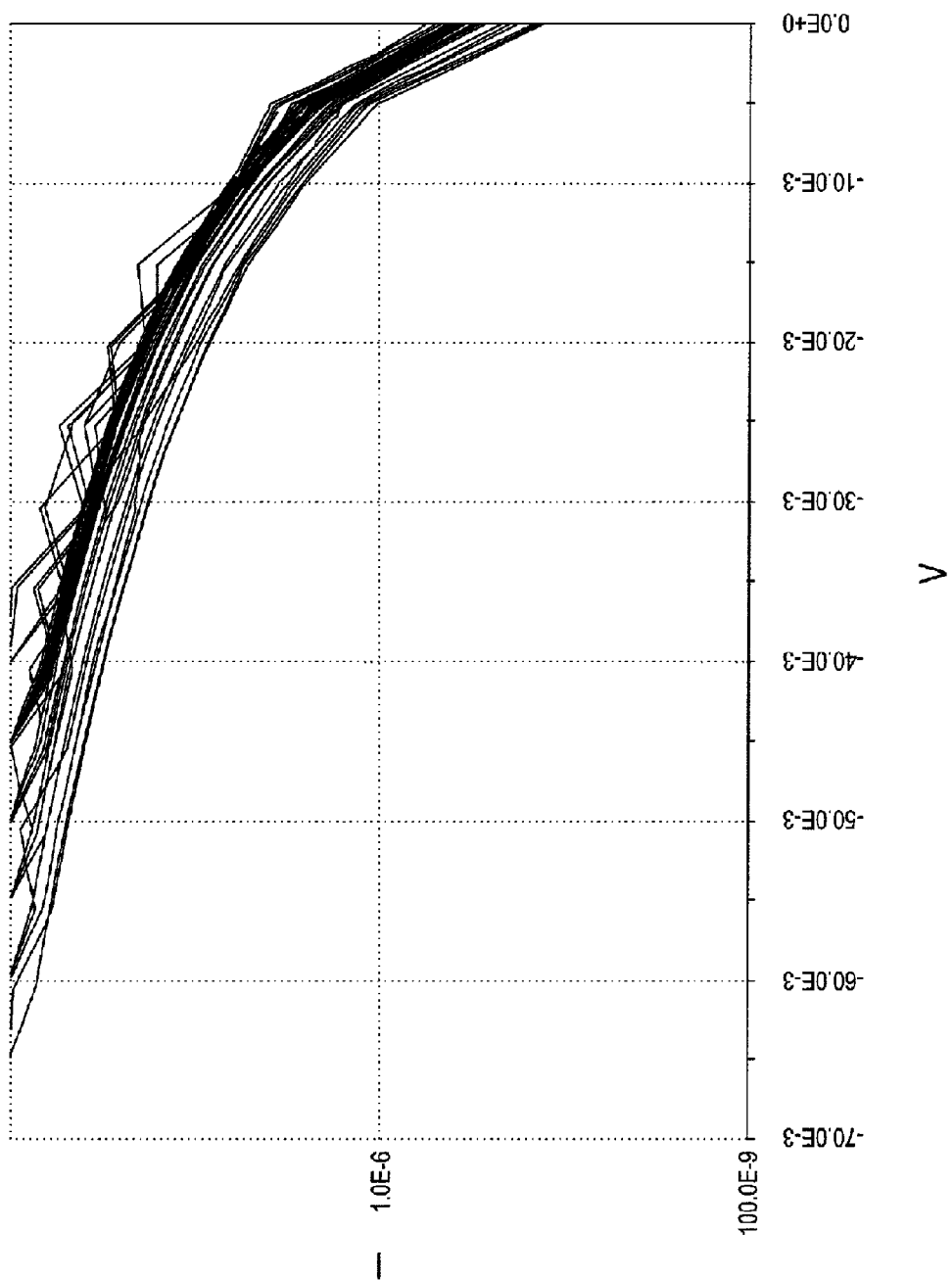
Figure 10:
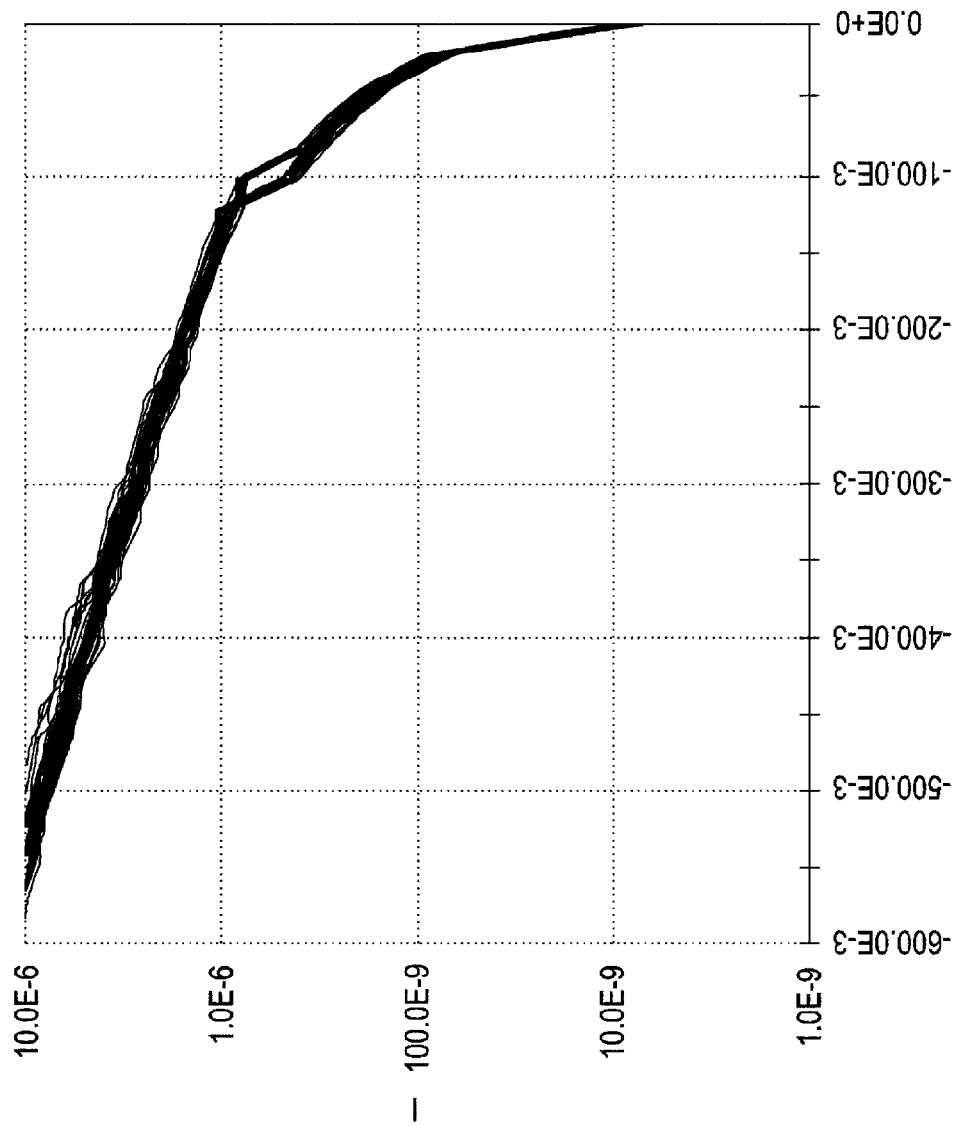
Figure 11:
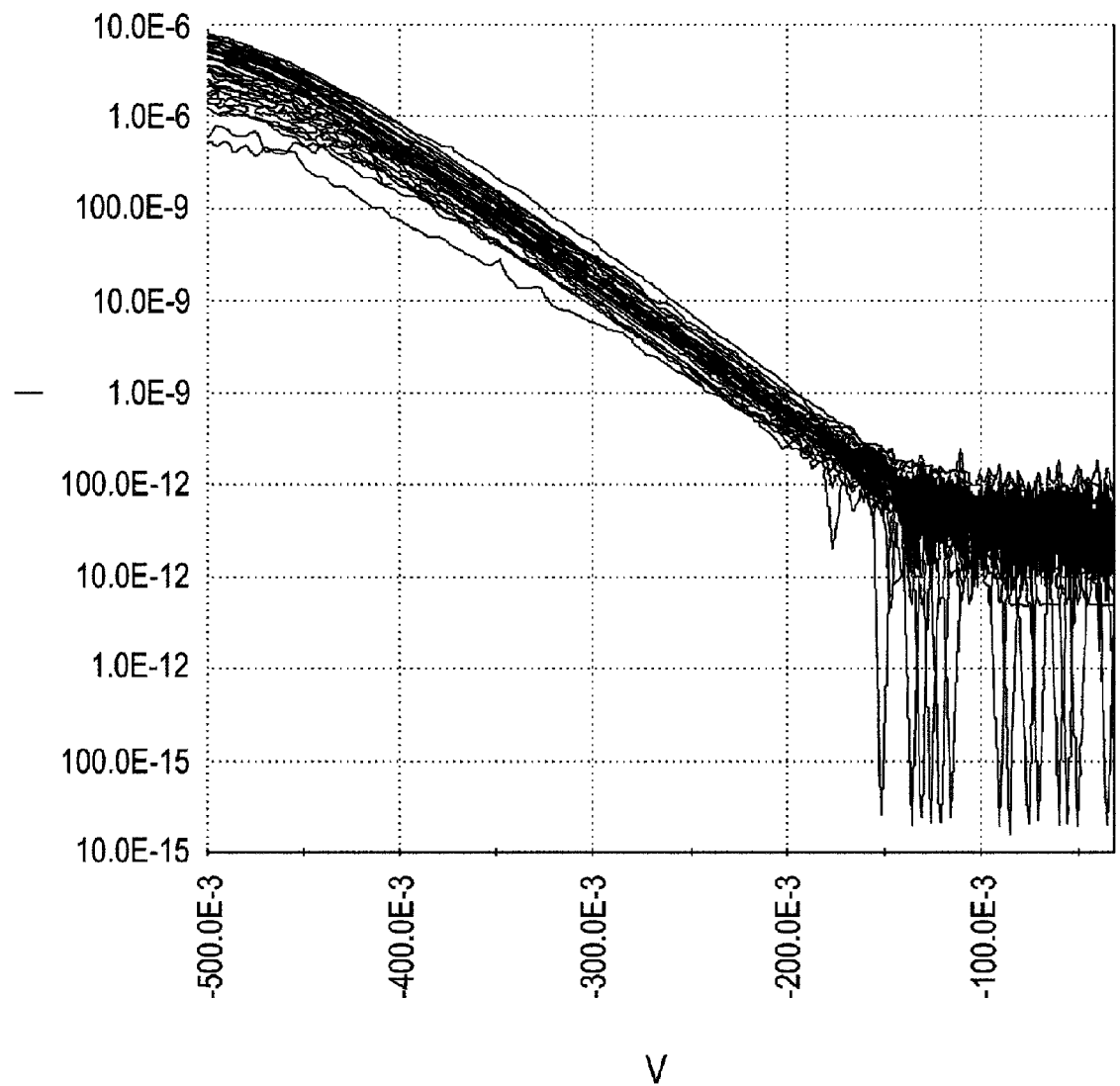

Other embodiments are described below:
  (1) Access devices with the $Cu_8GeS_6$ material in pore-cells with W bottom electrode and $Cu_3Ge$ (or any Cu-containing) top-electrode (TEC). FIG. 7 depicts the I-V characteristics (when the $Cu_3Ge$ TEC is swept negative with respect to the W) for a 70 nm access device as shown in FIG. 3 in a pore-cell configuration, wherein current measurements are limited to 100 pA on the lower side (due to noise limitations of the instrumentation and the setup) and current compliance is chosen to be at 10 µA.
  (2) Access devices with the $Cu_8GeS_6$ material in pore-cells with W bottom electrode (BEC) and W TEC. FIG. 8 depicts the I-V characteristics (for a 70 nm access device in FIG. 3 in a pore-cell configuration with W bottom and W top electrodes) when the W TEC is swept negative with respect to the W BEC. It should be noted that the area of the W TEC is >>area of the W BEC and that the current measurements are limited to 100 pA on the lower side (due to noise limitations of the instrumentation and the setup) and current compliance is chosen to be at 10 µA. It should also be noted that these devices (depending on processing conditions) have lower turn-on voltages and voltage-drops compared to the Cu-containing top-electrode devices.
  (3) Devices with a $Cu_aGe_bS_c$ material with a>60% (i.e., Cu-rich) and with built-in pore-cells with W BEC and Cu-containing TEC. FIG. 9 depicts the I-V characteristics of a 70 nm access device with Cu-rich $Cu_aGe_bS_c$ as in FIG. 3 in a pore-cell configuration with W bottom and W top electrodes. Current compliance is chosen to be at 10 µA. It should be noted that as Cu concentration increases beyond 60%, devices seem to be mostly shorted out and the device can be no longer used as an access device.
  (4) Access devices with $Cu_aGe_bS_c$ material with a <40% (i.e., Cu-deficient) and with built-in pore-cells with W BEC and W TEC. FIG. 10 depicts the I-V characteristics for a 70 nm access device with Cu-deficient (<40%) $Cu_aGe_bS_c$ as in FIG. 3 in a pore-cell configuration with W bottom and W top electrodes. Current compliance is chosen to be at 10 µA. It should be noted that as Cu concentration decreases below 40%, the current driving capability of these devices and the ON/OFF ratio drops off dramatically.
  (5) Access devices with $Cu_aAg_xGeS_6$ material in pore-cells with W BEC and W TEC. FIG. 11 depicts the I-V characteristics for a 70 nm access device with $Cu_aAg_xGeS_6$ as in FIG. 3 in a pore-cell configuration with W bottom and W top electrodes. Current compliance is chosen to be at 10 µA. Note that the Ag concentration could be used to control the turn-on voltage of the access device and/or the leakage levels.

FIG. 12a through FIG. 12f illustrate a mushroom shaped embodiment, a recessed mushroom shaped embodiment, a pillar cell shaped or lithographically defined pore embodiment, a litho pore embodiment, a sublitho pore embodiment, and a ring shaped embodiment, respectively. In FIG. 12a through FIG. 12f, top layer 1202 and bottom layer 1203 represent a metal layer formed of, for example, TiN or W or Cu or other Cu containing compounds with optional barrier and interfacial layers if necessary. Layer 1204 contains one or more layers of $M_8XY_6$ as per the teachings of the present invention, layer 1206 is a layer formed of, for example, oxide/nitride/dielectric/silicon or some combination of these layers, and layer 1208 is a metal layer formed of, for example, TiN or W. Layer 1205 is another layer of dielectric material and could be oxide/nitride/oxynitride, etc.

Figure 12A:
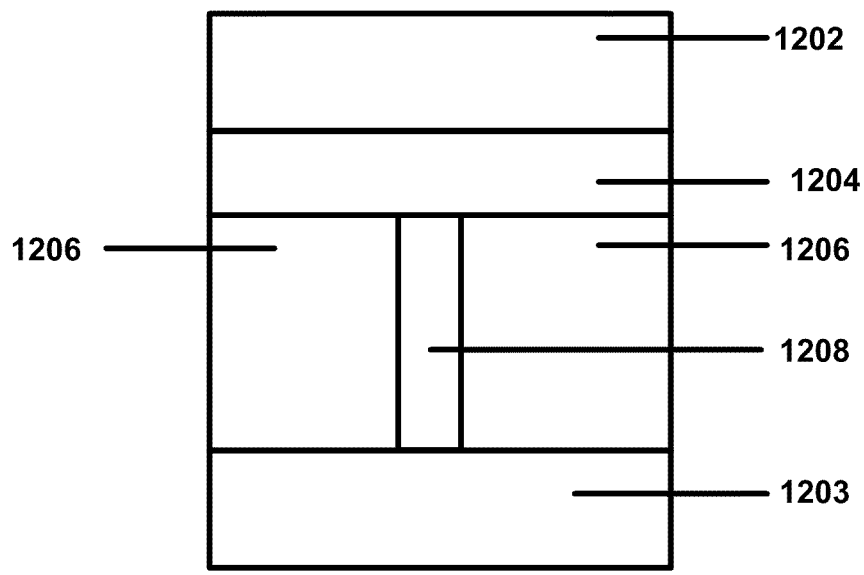
FIGS. 12a-12f illustrate a mushroom shaped embodiment, a recessed mushroom shaped embodiment, a pillar cell shaped or lithographically defined pore embodiment, a litho pore embodiment, a sublitho pore embodiment, and a ring shaped embodiment, respectively.
Figure 12B:
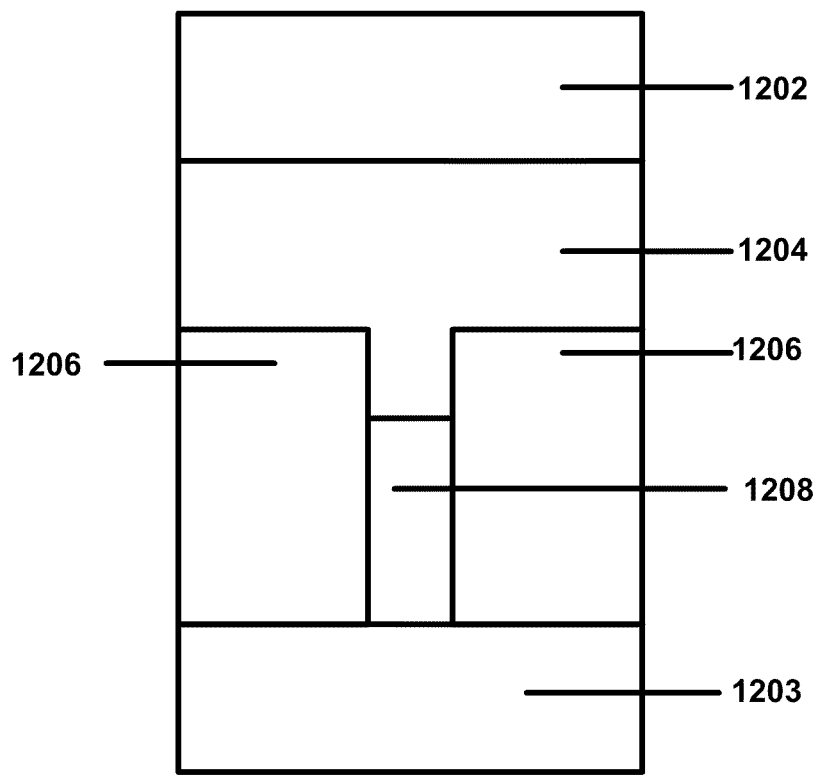
Figure 12C:
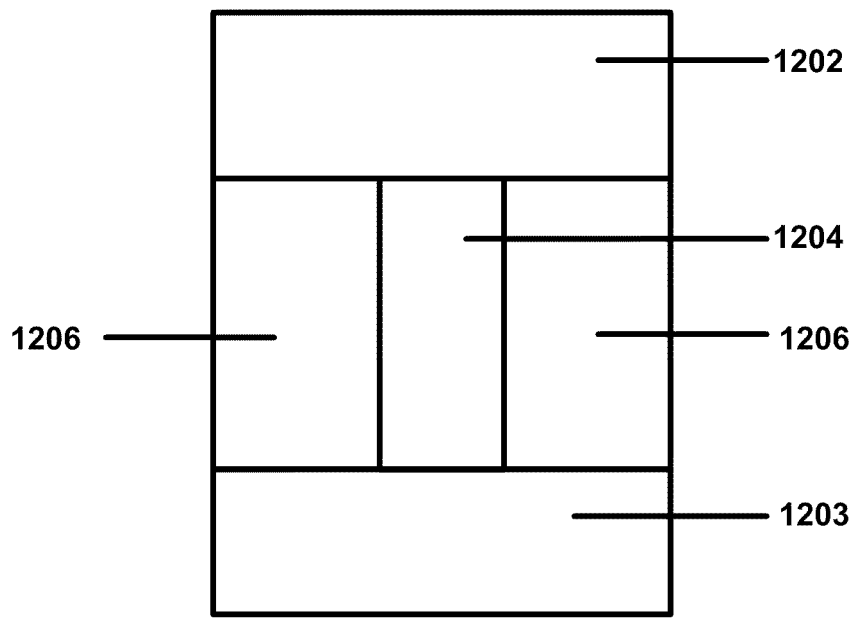
Figure 12D:
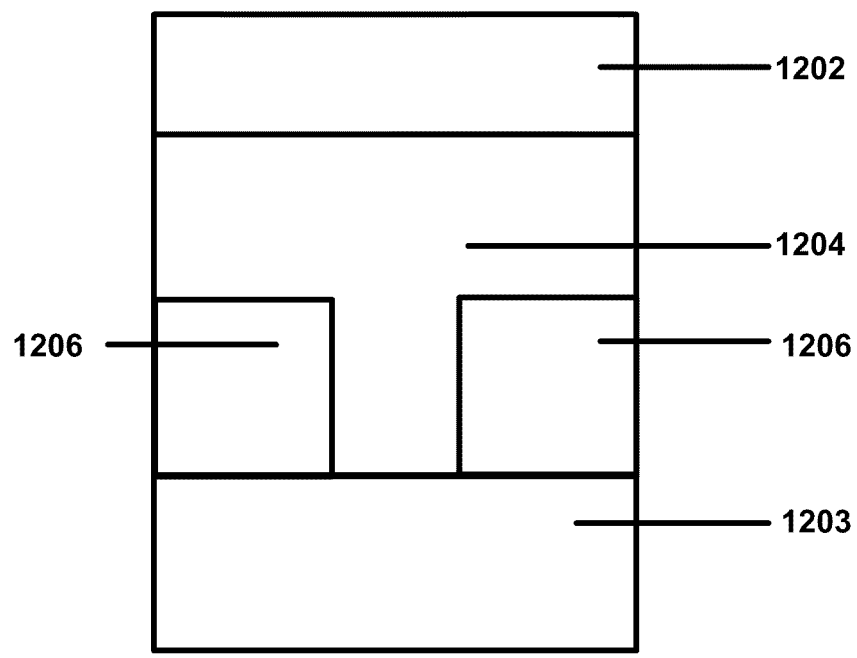
Figure 12E:
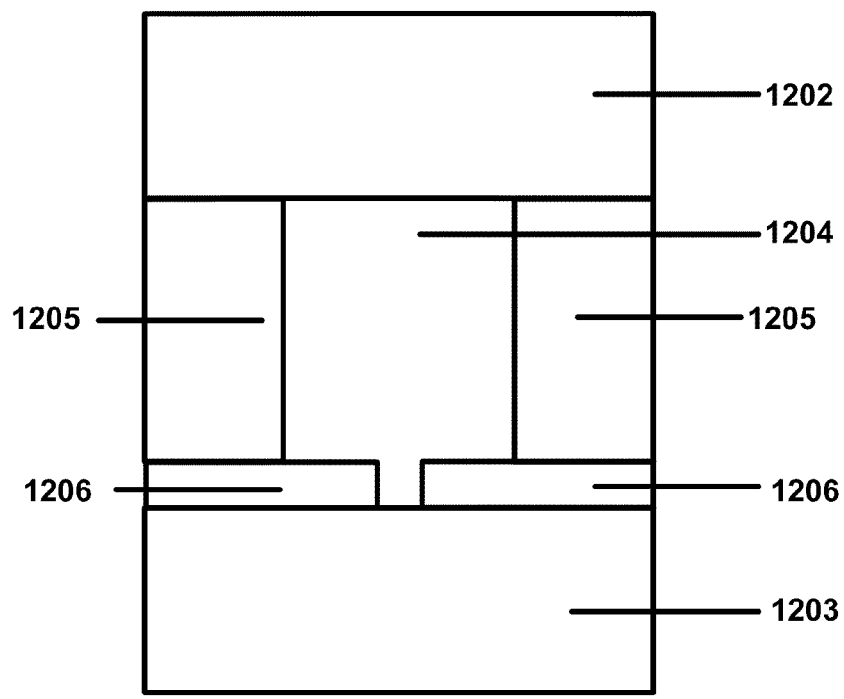
Figure 12F:
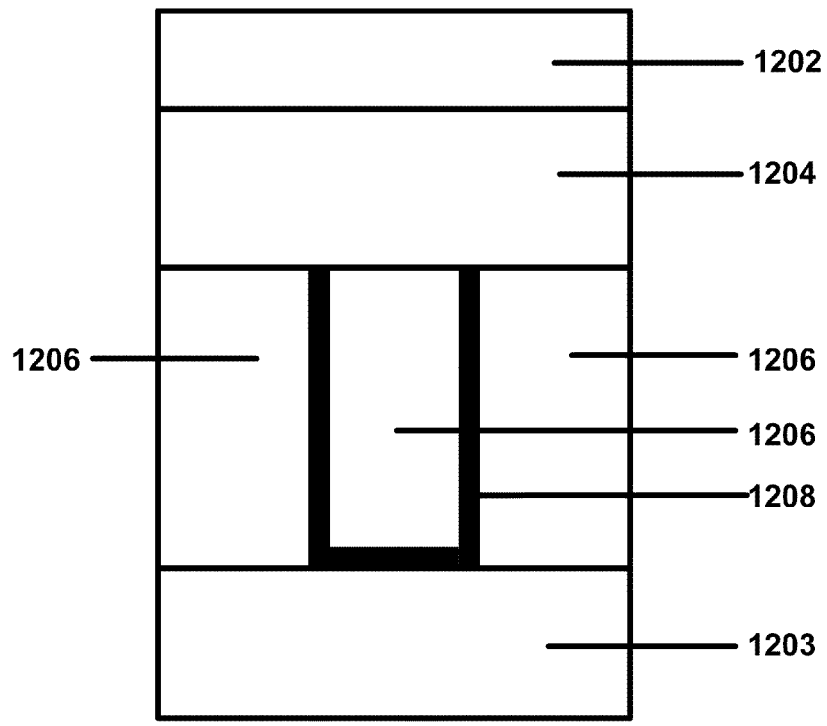

Further, for the mushroom (FIG. 12a), recessed mushroom (FIG. 12b) and the ring-shaped cell (FIG. 12f), while the bottom electrode 1203 (made, for example, from TiN or W) is typically a small-area contact, the $M_8XY_6$ layer 1204 could be a line-type or a "via-fill" type material (i.e., patterned in one dimension versus two dimensions). Similarly, for the litho pore embodiment shown in FIG. 12d and the sublitho pore embodiment shown in FIG. 12e, two options are possible where the bottom small-area via is 2D, but the top-pore could be either line type or via-fill type. The pillar embodiment shown in FIG. 12c is confined in both directions (i.e., 2D). Optional barrier layers, adhesion layers, passivation layers and capping layers have not been shown for convenience.

It should be noted that for all of the above-mentioned structures show in FIG. 12a through FIG. 12f, at least one electrode has to be inert (W/TiN/Al) and the other may be oxidizable (Cu or Cu containing compounds). If both of the electrodes have to be made with Cu, then at least one of them preferably has an inert liner to prevent Cu diffusion into the material during device operation.

It should also be noted that the options illustrated in FIG. 12a through FIG. 12f can be combined in various combinations for the memory element and for the access device to yield an acceptable structure. Non-limiting examples of such structures are provided below in FIG. 13 through FIG. 21. However, other combinations may also be constructed and are within the scope of the present invention.

Figure 13:
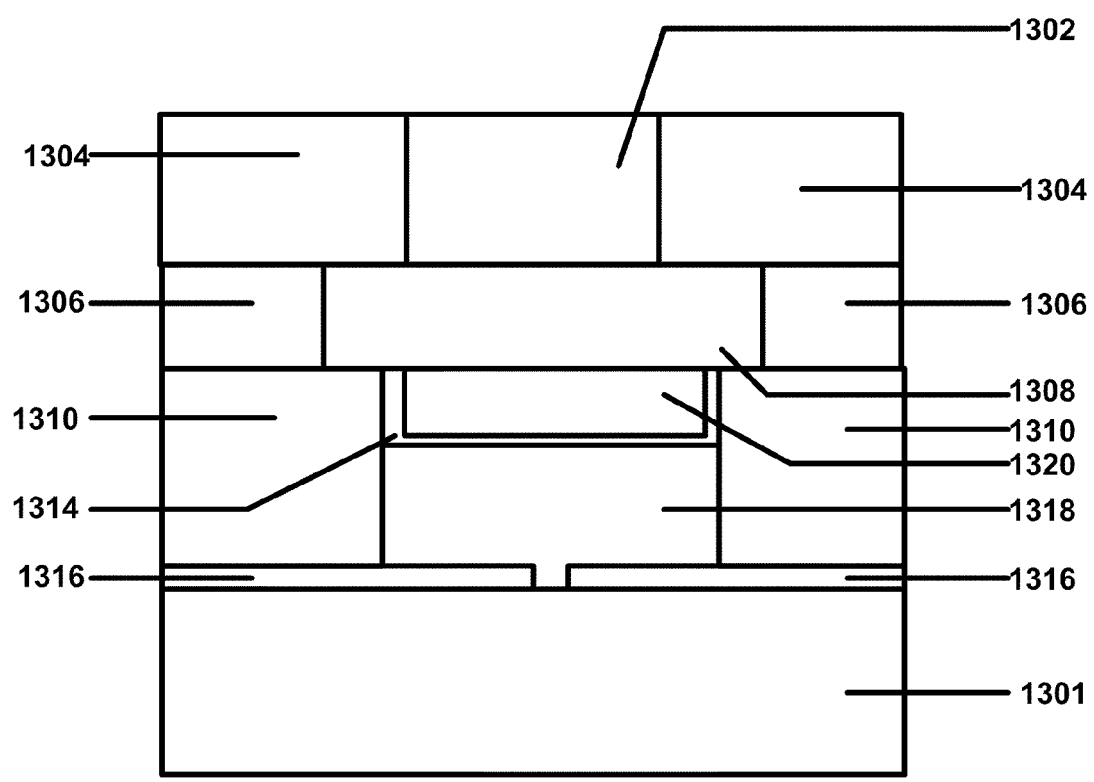
FIGS. 13-21 illustrate non-limiting examples of structures that are combinations of structures shown in FIG. 12a through FIG. 12f.

FIG. 13 illustrates a combination of a sublitho pore memory device structure with a patterned access device structure. The structure of FIG. 13 comprises the following layers: lower metal layer 1301, formed of, for example, TiN or W or Cu (with barrier layers), a first set of dielectric layers 1316, a first memory material layer 1318, a second set of dielectric layers 1310, another metal layer 1314 formed of, for example, TiN or W, an metal layer 1320, a $M_8XY_6$ layer 1308, a third set of dielectric layers 1306, an upper metal layer 1302 formed of, for example, TiN or W (or other materials), and a fourth set of dielectric layers 1304. Layers 1318 and 1308 may be patterned in one dimension or two.

Figure 14:
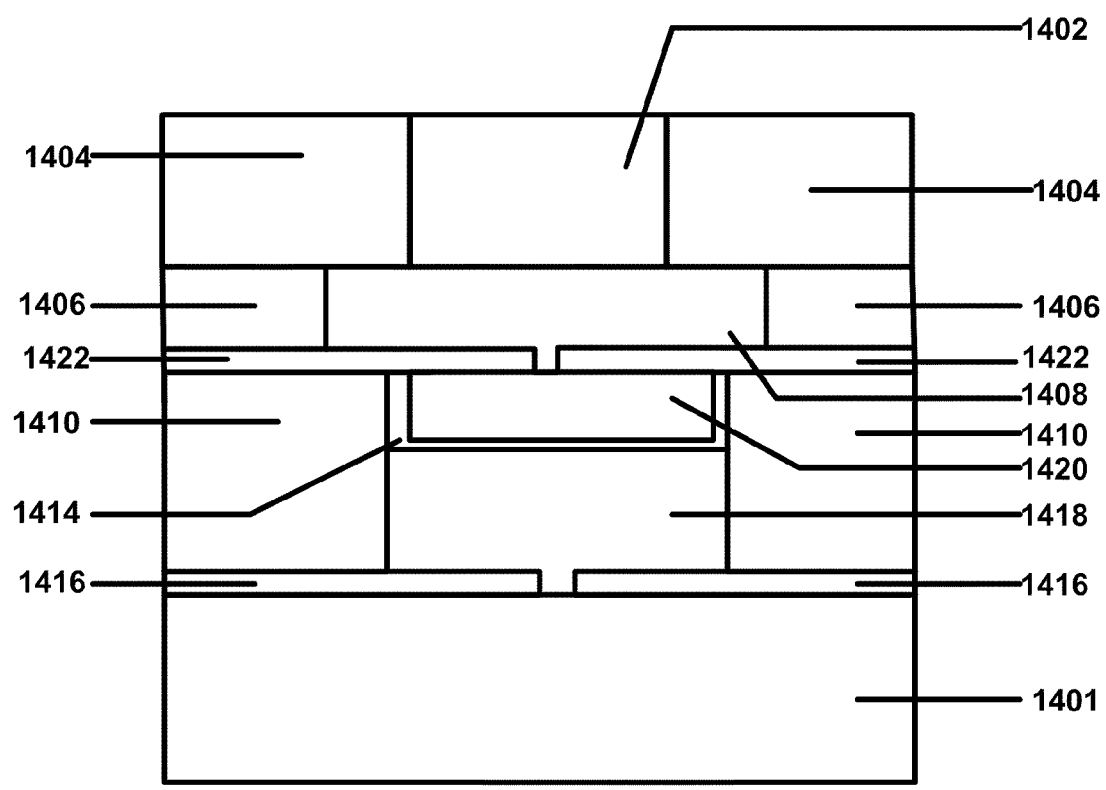

FIG. 14 illustrates a combination of a sublitho pore device structure for both the memory and access device. The structure of FIG. 14 comprises the following layers: lower metal layer 1401, formed of, for example, TiN or W or Cu (with barrier layers), a first set of dielectric layers 1416, a memory material layer 1418, a second set of dielectric layers 1410, another metal layer 1414 formed of, for example, TiN or W, an additional (possibly different metal) layer 1420, a $M_8XY_6$ layer 1408, a third set of dielectric layers 1406, an upper metal layer 1402 formed of, for example, TiN or W, and a fourth set of dielectric layers 1404. As above, layers 1418 and 1408 may be patterned in one dimension or two. Further, the structure of FIG. 14 is similar to FIG. 13, except that access device layer 1308 is a sublitho pore structure and, in addition to being flanked by the third set of dielectric layers 1406, the sublitho pore structure 1408 is flanked by a fifth set of dielectric layers 1422.

Figure 15:
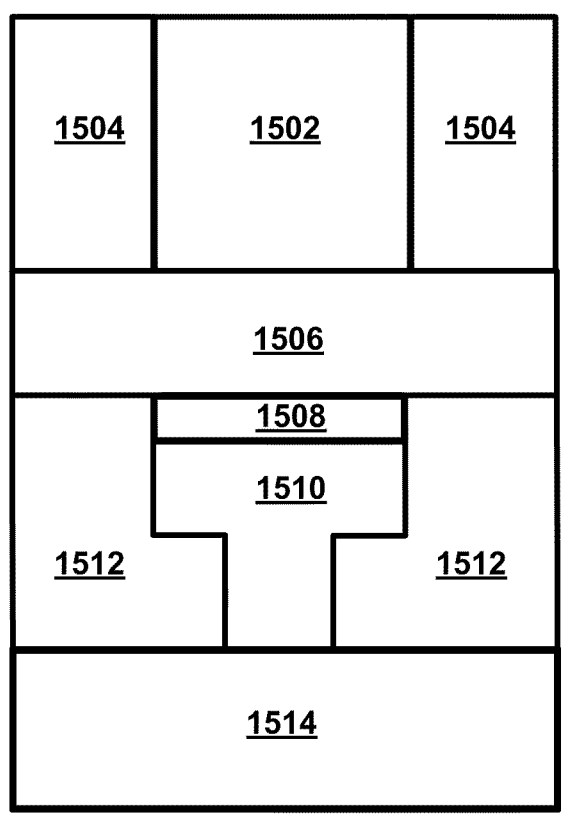

FIG. 15 illustrates a combination of a sublitho pore memory material structure with an unpatterned access device structure. The structure of FIG. 15 comprises the following layers: top electrode 1502 (which can be a combination of different materials Ag/Cu etc with optional barrier and interfacial layers), a first set of dielectric layers 1504, a $M_8XY_6$ layer 1506, top electrode 1508, a memory material layer 1510, a second set of dielectric layers 1512, and bottom electrode (made from, for example, a single metal or a combination of metals) 1514. In this structure, additional processing steps might be needed to prevent access device conduction paths in the direction parallel to the substrate.

Figure 16:
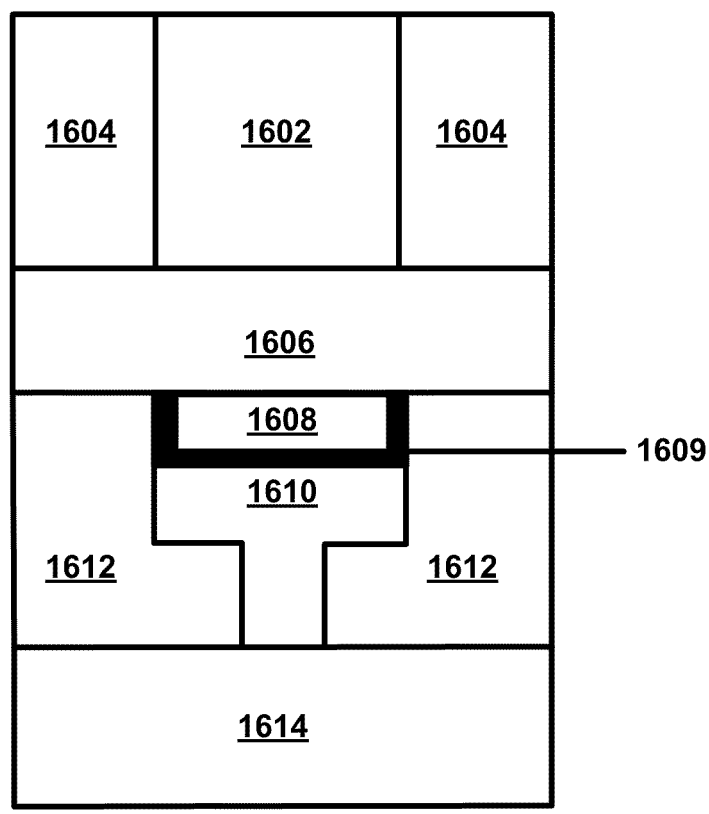

FIG. 16 illustrates a combination of a sublitho pore memory material structure with an unpatterned access device structure. The structure of FIG. 16 comprises the following layers: top electrode 1602 (which can be a combination of various metal layers and interfacial materials), a first set of dielectric layers 1604, a $M_8XY_6$ layer 1606, oxidizable top electrode 1608 that has an inert liner 1609, a memory material 1610, a second set of dielectric layers 1612, and bottom electrode (made from, for example, a single metal or a combination of metals) 1614. In this structure, additional processing steps might be needed to prevent access device conduction paths in the direction parallel to the substrate.

Figure 17:
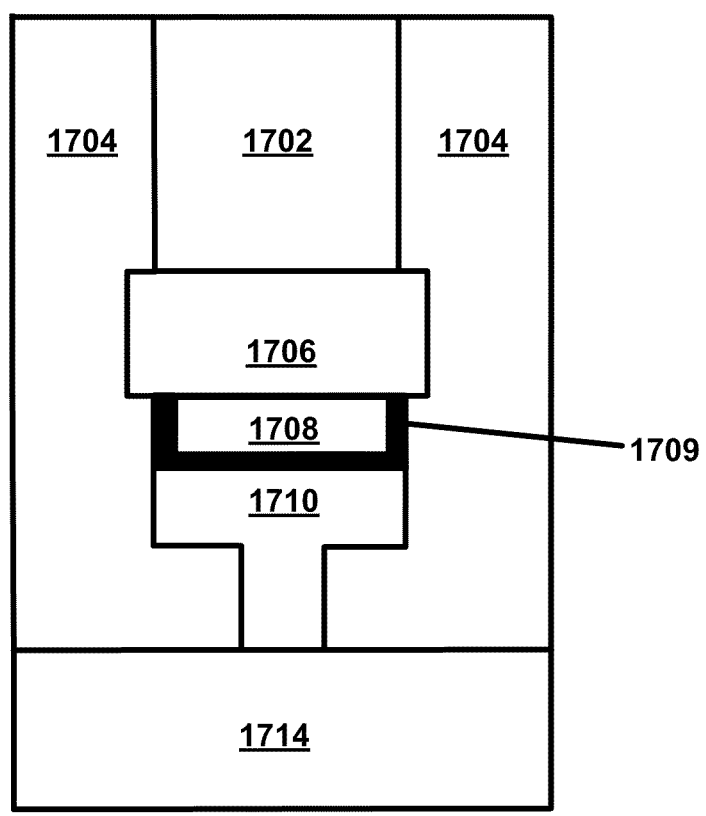

FIG. 17 illustrates a combination of a sublitho pore memory material structure with a patterned access device structure. The structure of FIG. 17 comprises the following layers: inert top electrode 1702 (which can be a combination of inert materials), a set of dielectric layers 1704, a $M_8XY_6$ layer 1706, additional top electrode 1708 that has an inert liner 1709, a memory material layer 1710, and bottom electrode (made from, for example, a single metal or a combination of metals) 1714.

Figure 18:
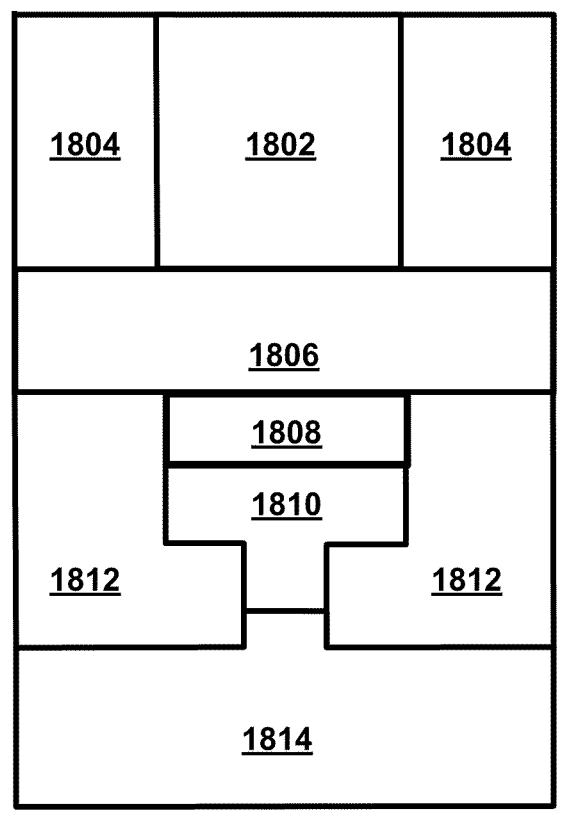

FIG. 18 illustrates a combination of a recessed mushroom memory material structure with an unpatterned access device structure. The structure of FIG. 18 comprises the following layers: top electrode 1802 (which can be a combination of different metal layers with optional barrier and interfacial layers), a first set of dielectric layers 1804, a $M_8XY_6$ layer 1806, inert electrode 1808, a recessed mushroom memory material layer 1810, a second set of dielectric layers 1812 and bottom electrode (made from, for example, a single metal or a combination of metals) 1814. In this structure, additional processing steps might be needed to prevent access device conduction paths in the direction parallel to the substrate.

Figure 19:
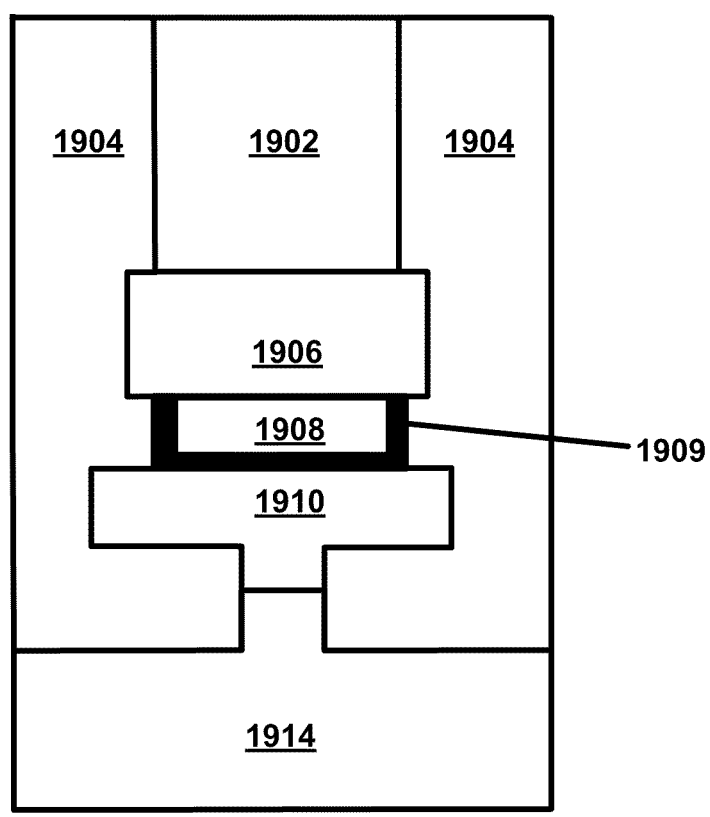

FIG. 19 illustrates a combination of a recessed mushroom memory material structure with a patterned access device structure. The structure of FIG. 19 comprises the following layers: inert top electrode 1902 (which can be a combination of inert materials), a set of dielectric layers 1904, a layer of patterned $M_8XY_6$ material 1906, metal electrode 1908 with inert layer 1909, a recessed mushroom shaped memory material layer 1910, and bottom electrode (made from, for example, a single metal or a combination of metals) 1914.

Figure 20:
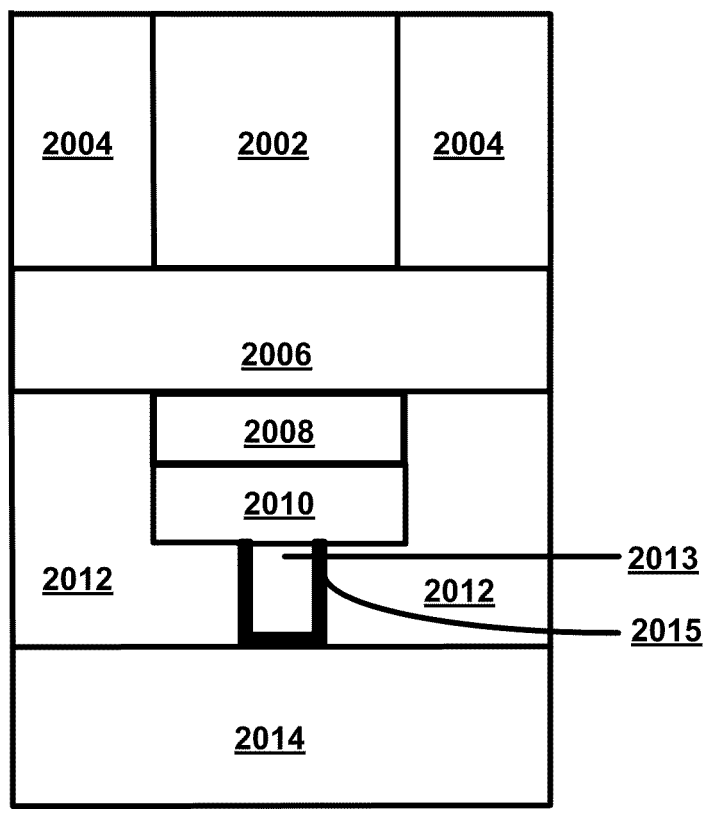

FIG. 20 illustrates a combination of a ring-shaped memory material structure with an unpatterned access device structure. The structure of FIG. 20 comprises the following layers: top electrode 2002 (which can be a combination of different materials with optional barrier layers), a first set of dielectric layers 2004, unpatterned $M_8XY_6$ layer 2006, top electrode 2008, mushroom shaped memory material 2010, a second set of dielectric layers 2012, a third dielectric region 2013, ring-type electrode 2015, and bottom electrode (made from, for example, a single metal or a combination of metals) 2014. In this structure, additional processing steps might be needed to prevent access device conduction paths in the direction parallel to the substrate.

Figure 21:
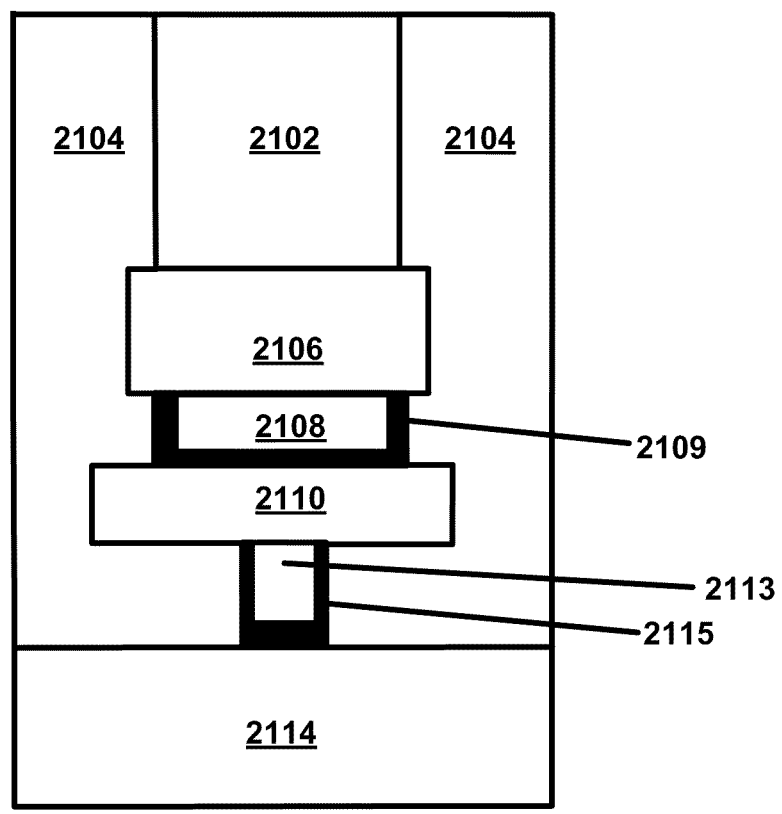

FIG. 21 illustrates a combination of a ring-shaped memory material structure with a patterned access device structure. The structure of FIG. 21 comprises the following layers: inert top electrode 2102 (which can be a combination of inert material with optional barrier and interfacial layers), a set of dielectric layers 2104, patterned $M_8XY_6$ material 2106, additional metal electrode 2108 with optional inert layers 2109, a memory material layer 2110, dielectric 2113, ring-type electrode 2115, and bottom electrode (made from, for example, a single metal or a combination of metals) 2114.

It should be noted that FIG. 13 through FIG. 21 are exemplary only and that each of the layers in these figures could comprise multiple layers. For example, the regions that indicate metal could comprise a series of metal/conductive layers with optional barrier layers and optional adhesion layers. Similarly the $M_8XY_6$ layer could comprise a series of layers and may include optional dielectric layers, buffer layers and adhesion layers. The dielectrics themselves could consist of a series of dielectric layers. Also, the preferred thickness of the various layers shown in each of these structures of FIGS. 11-19 may range from 1 nm to 5000 nm, preferably between 1 nm to 1 μm.

It should be noted that the above device structures depicted in FIG. 13 through FIG. 21 can be fabricated using conventional semiconductor processing techniques. For example, the various layers of the structures shown in FIG. 13 through FIG. 21 can be deposited using a variety of different techniques including, but not limited to, Chemical Vapor deposition (CVD), Physical Vapor deposition techniques (PVD—for example sputtering, evaporation etc), spin-on techniques, Atomic Layer deposition techniques (ALD), etc. Also, specific features of FIG. 13 through FIG. 21 can be defined using various lithography techniques, etching, chemical mechanical polishing, liftoff, etc. For fabricating each of these structures, various possible process flows are possible.

CONCLUSION

Devices and methods have been shown in the above embodiments for the effective implementation of a back end of line (BEOL) compatible high current density access device for high density arrays of electronic components. While various preferred embodiments have been shown and described, it will be understood that there is no intent to limit the invention by such disclosure, but rather, it is intended to cover all modifications falling within the spirit and scope of the invention, as defined in the appended claims.

The invention claimed is:

1. A device, comprising:
    a first conductive layer;
    a second conductive layer comprising a tungsten layer; and
    a $M_8XY_6$ layer sandwiched in between said first conductive layer on top and said second conductive layer on bottom, wherein
    (i). M includes at least one element selected from the group consisting of Cu, Ag, Li, and Zn,
    (ii). X includes at least one Group XIV element, and
    (iii). Y includes at least one Group XVI element,
    wherein said first conductive layer, second conductive layer and $M_8XY_6$ layer are in proximity to each other, thereby allowing current to pass through.

2. The device of claim 1, wherein X includes at least one element selected from the group consisting of Ge, Si, Sn, and C.

3. The device of claim 1, wherein Y includes at least one element selected from the group consisting of Se, S, O, and Te.

4. The device of claim 1, wherein said first conductive layer is any of the following: a Cu-containing layer and a $Cu_3Ge$ layer.

5. The device of claim 1, wherein M comprises a plurality of elements $M_{a1} \ldots M_{an}$, and $a_1 + \ldots + a_n = 8$.

6. The device of claim 1, wherein said M8XY6 is any of the following: $Cu_8GeS_6$, $Cu_8GeSe_6$ and $Ag_{4.7}Cu_{3.3}GeS_6$.

7. A device, comprising:
    an $M_aX_bY_c$ material contacted on opposite sides by respective layers of conductive material, wherein at least one of said conductive layers includes an electrode that is inert with respect to the $M_aX_bY_c$ material, and wherein:
    (i). M includes at least one element selected from the group consisting of Cu, Ag, Li, and Zn,
    (ii). X includes at least one Group XIV element,
    (iii). Y includes at least one Group XVI element, and
    wherein a is in the range of 48-60 atomic percent, b is in the range of 4-10 atomic percent, c is in the range of 30-45 atomic percent, and a+b+c is at least 90 atomic percent, and wherein said $M_aX_bY_c$ material and said layers of conductive material are in proximity to each other, thereby allowing current to pass through.

8. The device of claim 7, wherein X includes at least one element selected from the group consisting of Ge, Si, Sn, and C.

9. The device of claim 7, wherein Y includes at least one element selected from the group consisting of Se, S, O, and Te.

10. The device of claim 7, wherein the $M_aX_bY_c$ material is an argyrodite material of the formula $M_8X_1Y_6$.

11. The device of claim 10, wherein said M8XY6 is any of the following: Cu8GeS6, $Cu_8GeSe_6$ and $Ag_{4.7}Cu_{3.3}GeS_6$.

12. The device of claim 7, wherein an other one of said conductive layers is any of the following: a Cu-containing layer and a $Cu_3Ge$ layer.

13. The device of claim 7, wherein an amount of current passed by said device varies by a factor of at least $10^6$ in response to varying the applied voltage by 0.5 V.

14. The device of claim 7, further including a first dielectric layer between the $M_aX_bY_c$ material and one of the conductive layers.

15. The device of claim 14, further including a second dielectric layer between the $M_aX_bY_c$ material and the other one of the conductive layers.

16. The device of claim 7, wherein the $M_aX_bY_c$ material includes both Cu and Ag, wherein each of Cu and Ag constitute at least 1 atomic percent of the $M_aX_bY_c$ material.

17. The device of claim 7, further including a dopant, the dopant being at least one element selected from the group consisting of N, P, Zn, W, Sb, F, Cl, Br and I, the dopant constituting at least 1 atomic percent but less than 10 atomic percent of the $M_aX_bY_c$ material.

18. An apparatus, comprising:
    a first device as described by claim 7; and
    a second device as described by claim 7, wherein the first and second devices are in series.

19. A crossspoint memory array, comprising:
    bit lines;
    word lines; and
    crosspoint elements at the intersection of the bit lines and the word lines, wherein each crosspoint element includes a memory element and a device as described by claim 7.

20. The device of claim 19, wherein the amount of current passed by each device varies by a factor of at least $10^6$ in response to varying the applied voltage by 0.5 V.

21. The array of claim 19, wherein each memory element includes a phase change memory material.

* * * * *